(12) United States Patent
Spencer et al.

(10) Patent No.: US 9,609,778 B1
(45) Date of Patent: Mar. 28, 2017

(54) SERVER HAVING A LATCH

(71) Applicant: Hewlett-Packard Development Company, L.P., Houston, TX (US)

(72) Inventors: Stephen Spencer, Houston, TX (US); Earl W. Moore, Cypress, TX (US); Vincent Nguyen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/875,066

(22) Filed: Oct. 5, 2015

(51) Int. Cl.
*G06F 1/18* (2006.01)
*H05K 7/14* (2006.01)
*A47B 88/04* (2006.01)

(52) U.S. Cl.
CPC ............ *H05K 7/1411* (2013.01); *A47B 88/04* (2013.01); *G06F 1/183* (2013.01)

(58) Field of Classification Search
None
See application file for complete search history.

(56) References Cited

U.S. PATENT DOCUMENTS

| | | | | |
|---|---|---|---|---|
| 6,392,884 B1 * | 5/2002 | Chou | ................ | G06F 1/184 360/98.01 |
| 6,549,402 B2 * | 4/2003 | Chin | ................ | G06F 1/20 340/693.5 |
| 6,621,693 B1 * | 9/2003 | Potter | ................ | G06F 1/184 257/E23.099 |
| 6,695,520 B1 * | 2/2004 | Sarno | ................ | H05K 7/1409 292/64 |
| 6,853,548 B2 * | 2/2005 | Vanderheyden | ...... | H05K 7/1487 361/679.02 |
| 7,259,325 B2 * | 8/2007 | Pincu | ................ | H04Q 1/02 174/50 |
| 7,301,778 B1 * | 11/2007 | Fang | ................ | H05K 7/1487 312/223.2 |
| 7,403,390 B2 * | 7/2008 | Franz | ................ | H05K 7/20727 165/104.33 |
| 7,515,429 B1 * | 4/2009 | Schmidt | ................ | G06F 1/18 248/917 |
| 7,684,208 B2 | 3/2010 | Okamoto | | |
| 7,729,113 B2 | 6/2010 | Olesiewicz | | |
| 7,782,603 B2 | 8/2010 | Curnalia | | |

(Continued)

FOREIGN PATENT DOCUMENTS

| | | |
|---|---|---|
| CN | 203643913 | 6/2014 |
| CN | 203786615 | 8/2014 |

OTHER PUBLICATIONS

HP StorageWorks Modular Smart Array 70 Enclosure—Replacing the Hard Drive Blank and the Hard Drive, 2015 Hewlett-Packard Development Company, L.P., 4 pps, <http://h20564.www2.hp.com/hpsc/doc/public/display?docId=emr_na-c00879641&sp4ts.oid=3355734 >.

*Primary Examiner* — Xanthia C Cunningham
(74) *Attorney, Agent, or Firm* — International IP Law Group, PLLC

(57) ABSTRACT

Example techniques for using a release latch to access a second tray of a server are disclosed. An example method includes operating a server in a rack. A release latch is engaged to initiate movement of a first tray of the server away from a second tray located behind the first tray. The second tray can then be accessed to remove and replace a storage drive from the second tray while the server remains in operation.

17 Claims, 12 Drawing Sheets

(56) References Cited

U.S. PATENT DOCUMENTS

| | | | | |
|---|---|---|---|---|
| 7,983,032 B2* | 7/2011 | Walker | G06F 1/187 | 312/223.2 |
| 8,054,620 B2* | 11/2011 | Roesner | G11B 33/128 | 312/223.2 |
| 8,369,079 B2* | 2/2013 | Collins | G06F 1/187 | 312/332.1 |
| 8,427,823 B2* | 4/2013 | Yamada | G11B 33/128 | 312/223.1 |
| 8,675,355 B2 | 3/2014 | Wallace | | |
| 9,055,690 B2* | 6/2015 | Ross | G06F 1/187 | |
| 9,245,587 B2* | 1/2016 | Chen | G11B 33/128 | |
| 9,265,173 B1* | 2/2016 | Jhang | G11B 33/128 | |
| 9,326,415 B2* | 4/2016 | Rauline | H05K 7/1489 | |
| 2002/0181197 A1* | 12/2002 | Huang | H05K 7/1421 | 361/679.39 |
| 2003/0002261 A1* | 1/2003 | Berry | H05K 7/1489 | 361/727 |
| 2005/0168932 A1* | 8/2005 | Selvidge | G06F 1/184 | 361/679.33 |
| 2006/0134953 A1* | 6/2006 | Williams | H05K 7/1411 | 439/157 |
| 2007/0223207 A1* | 9/2007 | Nguyen | H05K 7/1411 | 361/801 |
| 2007/0247805 A1* | 10/2007 | Fujie | G11B 33/12 | 361/679.49 |
| 2010/0118484 A1* | 5/2010 | Sasagawa | H05K 7/20736 | 361/679.37 |
| 2010/0214749 A1* | 8/2010 | Lee | H05K 7/1409 | 361/754 |
| 2011/0043994 A1* | 2/2011 | Cheng | G06F 1/187 | 361/679.33 |
| 2011/0267761 A1* | 11/2011 | Peng | G11B 33/128 | 361/679.31 |
| 2012/0236491 A1* | 9/2012 | Wallace | G06F 1/187 | 361/679.33 |
| 2013/0018505 A1* | 1/2013 | Barrett | G06F 19/3462 | 700/231 |
| 2013/0081422 A1* | 4/2013 | Park | F25D 11/00 | 62/448 |
| 2013/0335913 A1* | 12/2013 | Brashers | G06F 1/187 | 361/679.39 |
| 2013/0342990 A1* | 12/2013 | Jau | G06F 1/187 | 361/679.39 |
| 2014/0036434 A1* | 2/2014 | Jau | G06F 1/16 | 361/679.33 |
| 2014/0362515 A1* | 12/2014 | Pronozuk | H05K 7/1488 | 361/679.31 |

* cited by examiner

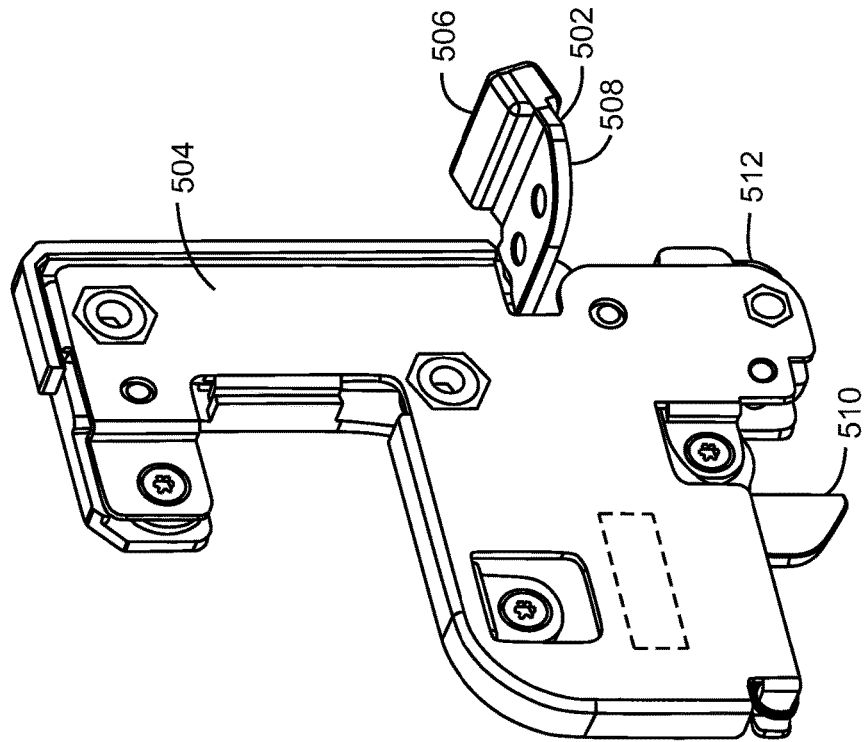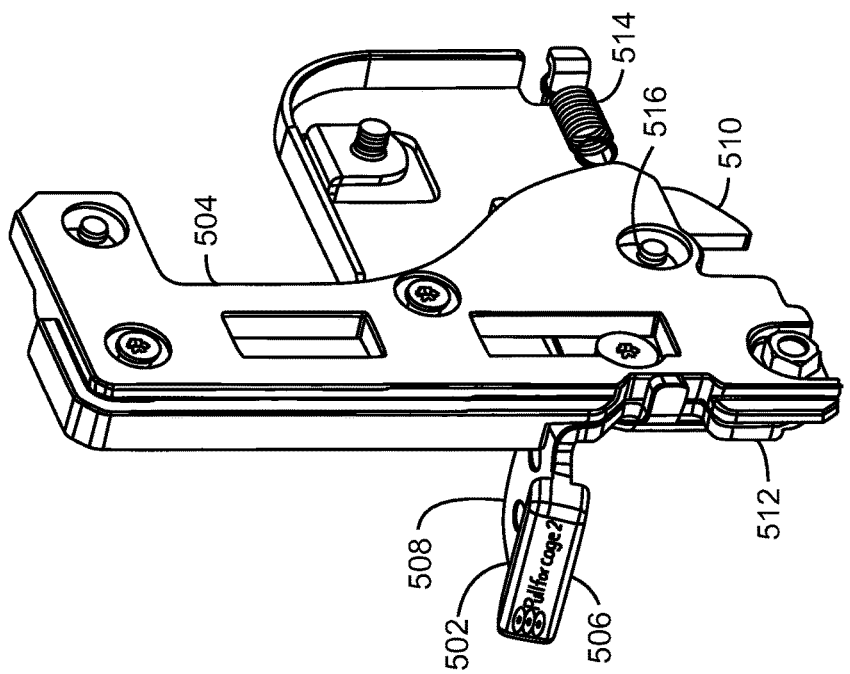
FIG. 5

800

814

SERVER HAVING A LATCH

BACKGROUND

Computer technology is becoming more sophisticated as more storage drives are added to servers. More storage drives may result in increased memory capacity or density, and increased data processing capability.

DESCRIPTION OF THE DRAWINGS

Certain examples are described in the following detailed description and in reference to the drawings, in which:

FIG. 5 is perspective views of an example release latch system having a release latch and associated latch assembly;

DETAILED DESCRIPTION

Data processing is the collection and manipulation of data to produce meaningful information. Data processing can be accomplished by single servers, multiple servers arranged in a server rack, and multiple server racks in a data processing center, and so forth. Servers may have a processing component and a tray having storage drives such as hard disk drives (HDDs) and/or solid state drives (SSDs).

The number of storage drives or HDDs in a server is on the rise. For instance, the advent of the small form factor (SSF) disk drive may facilitate increasing the number of HDDs in a server tray. For some servers, instead of 12 large form factor (LFF) disk drives, a server tray can now accommodate 24 SSF disk drives. To further increase the number of HDDs, more trays are being added to servers.

The addition of more trays to servers may make access to the tray(s) difficult for users. In one example, the first tray located at the front of the server may be readily accessible, e.g., once the faceplate has been removed if a faceplate is employed. However, trays in the server located behind the first tray may not be so easily accessible. Removal of the chassis to access these trays may not be a feasible alternative, especially when a server is bolted to the frame of a server rack.

As disclosed herein, for an example of a server with a first tray and a second tray, a release latch may be used to move the first tray away from the second tray located behind the first tray. The first tray may separate from the second tray, thereby creating a space between the first and second trays. The space may be large enough to facilitate the removal of a storage drive from the second tray and the installation of a new storage drive in the second tray. The release latch may include text that informs the user to engage the release latch to access the second tray. Further, the imprinted surface (having the text) of the release latch may be angled upward to promote visibility of the text. The release latch may be used on a standalone server, or multiple servers in a storage rack.

Figure 1:
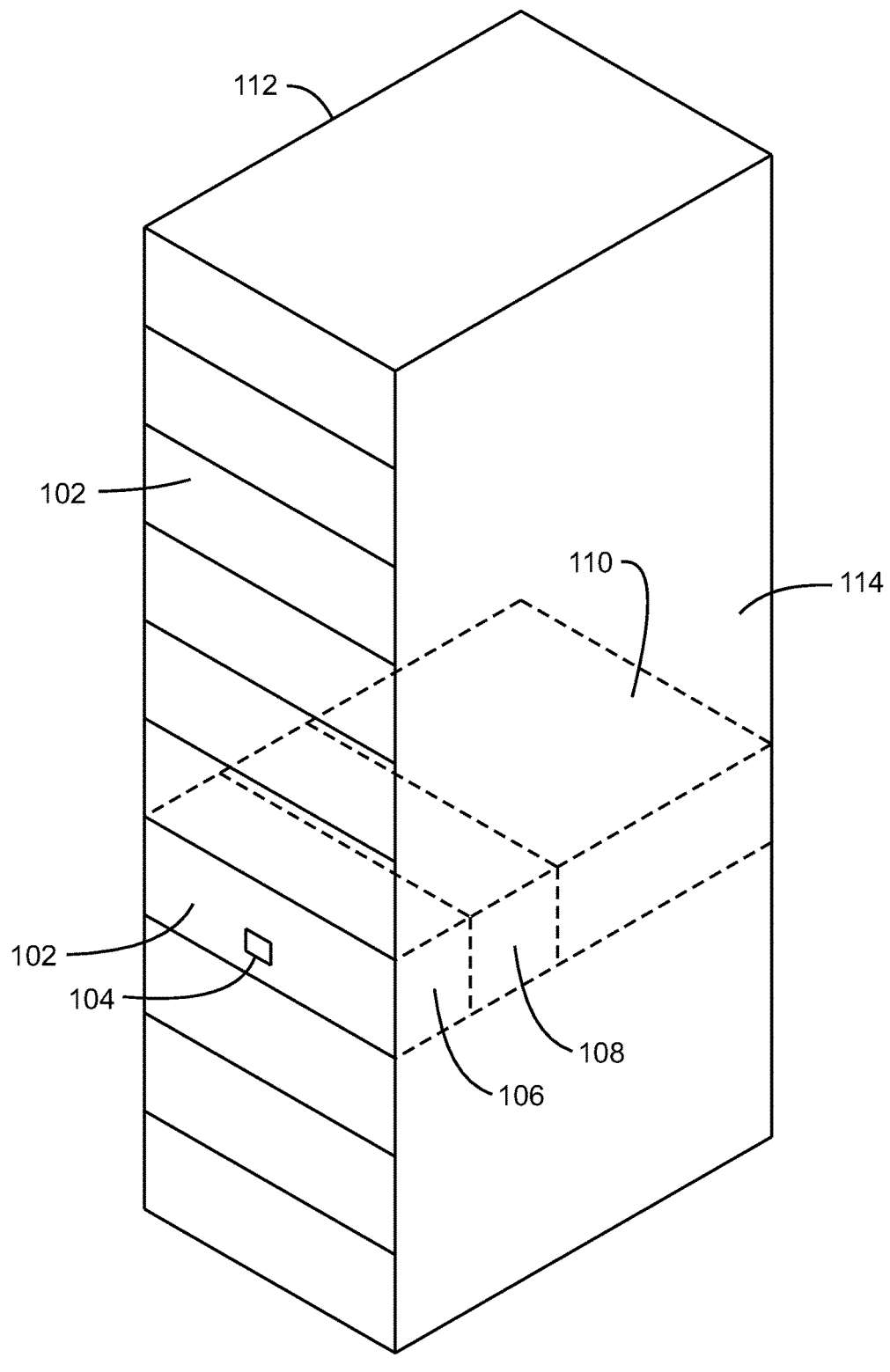
FIG. 1 is a perspective view of an example server rack.

FIG. 1 is a perspective view of an example server rack 100. The server rack 100 may have multiple servers 102, with one or more of the servers 102 having at least one latch 104. In the illustrated example, a server 102 is generally disposed on each level of the server rack 100. The servers 102 may be stacked above and below one another.

One or more of the servers 102 may have at least two trays, a first tray 106 and a second tray 108. In certain examples, the first tray 106 may be located at a front portion of the server 102, and the second tray 108 may be located at a middle portion of the server 102 behind the first tray 106. A processing component 110 may be located at a back portion of the server 102 behind the second tray 108.

A release latch 104 may be located on a front portion of the server 102. The release latch 104 may be coupled to the first tray 106. When engaged by a user, the release latch 104 may initiate movement of the first tray 106 with respect to the second tray 108 to facilitate access to the second tray 108.

The server rack 100 may be a cabinet in which case the stack of servers 102 may be completely enclosed. Alternatively, the server rack 100 may not have sides 112 and 114, for example. Other configurations may be accommodated. The server rack 100 may be made of sheet metal or similar materials. The sheet metal or similar materials may have panels for accessing the servers 102.

Figure 2:
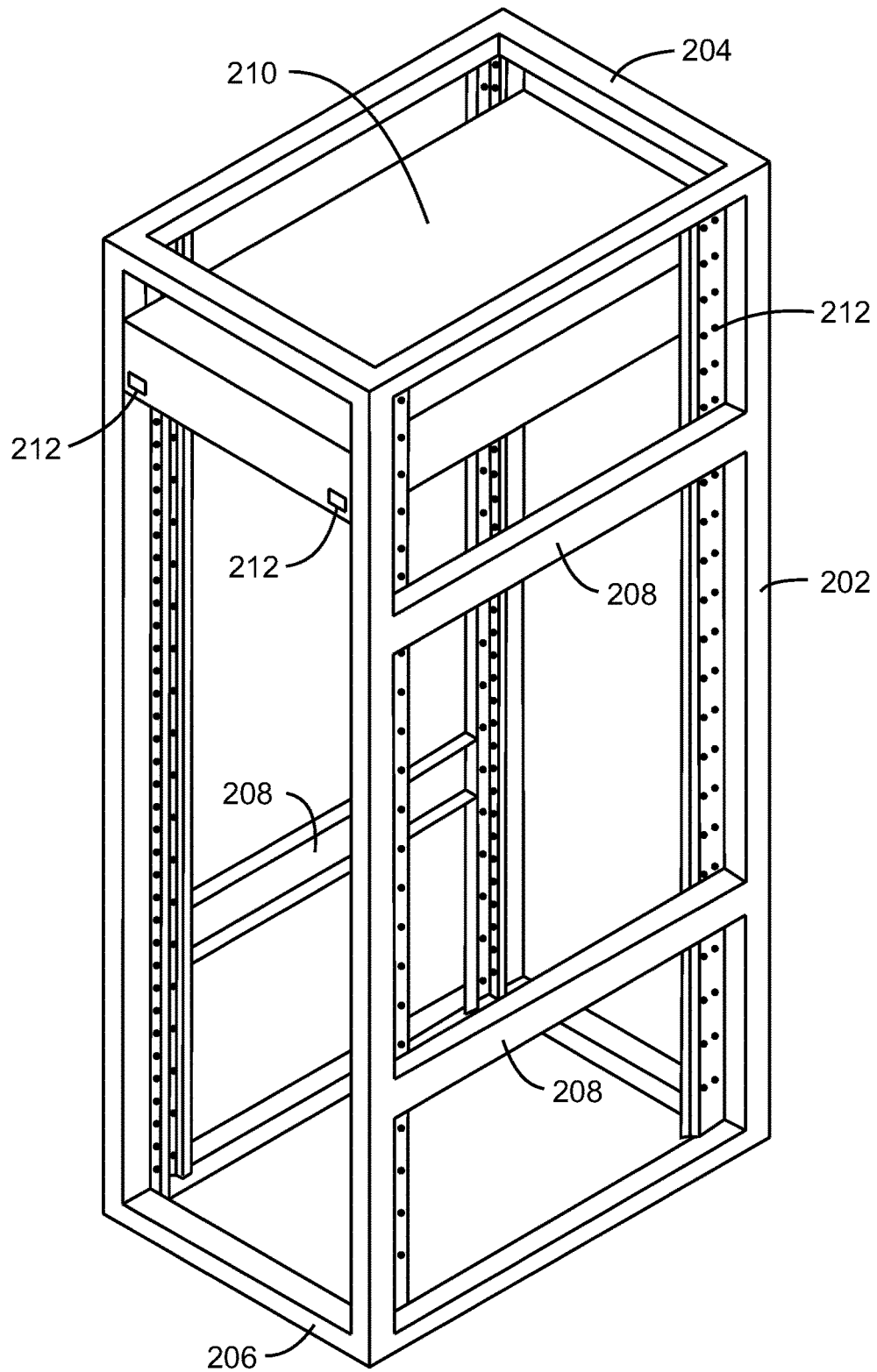
FIG. 2 is a perspective view of the example server rack of FIG. 1 with at least the sides removed.

FIG. 2 is a perspective view of the server rack 100 of FIG. 1 with the sides 112 and 114 removed, and the server rack labeled with the reference number 200. The server rack 200 may have legs 202, a top portion 204, a bottom portion 206, and bracing 208. The server rack 200 may have components for controlling temperature, ventilation, cooling, and so forth. Further, management software may monitor power consumption and thermal output within the rack 200. Different types and variations of server racks 200 may be used. An exemplary rack standard is Electronic Industries Association EIA-310.

The width of a space or slot in the server rack 200 may be a standard 19 or 23 inches, for example, or any other width. An exemplary unit for measuring the height of rack 200 is a rack unit, referred to as a "U," which equals about 1.75 inches. The overall height of a server rack 200 may be measured in units of U, such as "21U" or "42U," for example. Similarly, the height of a server 210 (e.g., analogous to the server 102 of FIG. 1) installed in the rack 200 may be measured in units of U, such as 1U, 2U, 3U, and so on. Further, in the illustrated embodiment, the server 210 has two latches 212 that may facilitate separation or movement of a first tray of the server 210 away from a second tray of the server 210.

As for the server rack 200, the legs 202 may have holes 212 which facilitate securing the server 210 to the server rack 200. The types of holes 212 may vary based on manufacturer, application, and so forth, and may be in accord with the EIA-310 rack standard. The holes 212 may be unthreaded or threaded, round or square, and so forth. In certain embodiments, the holes 212 may be at regular intervals and in horizontal pairs. The holes 212 in the legs 202 may be arranged vertically in sets of three, with the pattern repeating every U (1.75 inches), for example.

Figure 3:
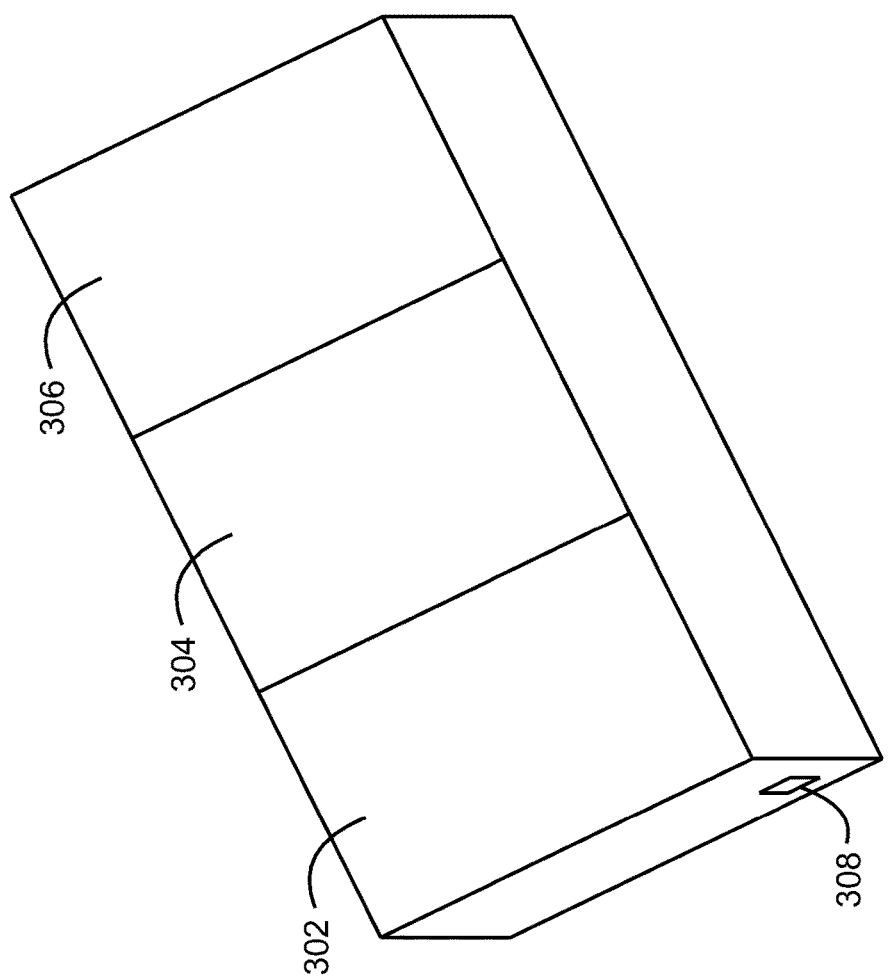
FIG. 3 is a perspective view of an example server, such as an example server for a server rack (e.g., FIGS. 1 and 2)

FIG. 3 is a perspective view of an example server 300, such as the server 210 removed from the server rack 200 of FIG. 2. The server 300 may have at least two trays, a first tray 302 and a second tray 304, both of which may house storage drives. The first tray 302 may be located near or at the front of the server 300. The second tray 304 may be located behind the first tray 302. A processing component 306 may be located behind the second tray 304 near or at the back of the server 300. One or more release latches 308 may be located on the server 300, such as at the front of the server 300 as depicted. When engaged by a user, the release latch 308 may initiate movement of the first tray 302 with respect to the second tray 304. The first tray 302 and the second tray 304 may thus separate to facilitate access to the second tray 304.

Figure 4:
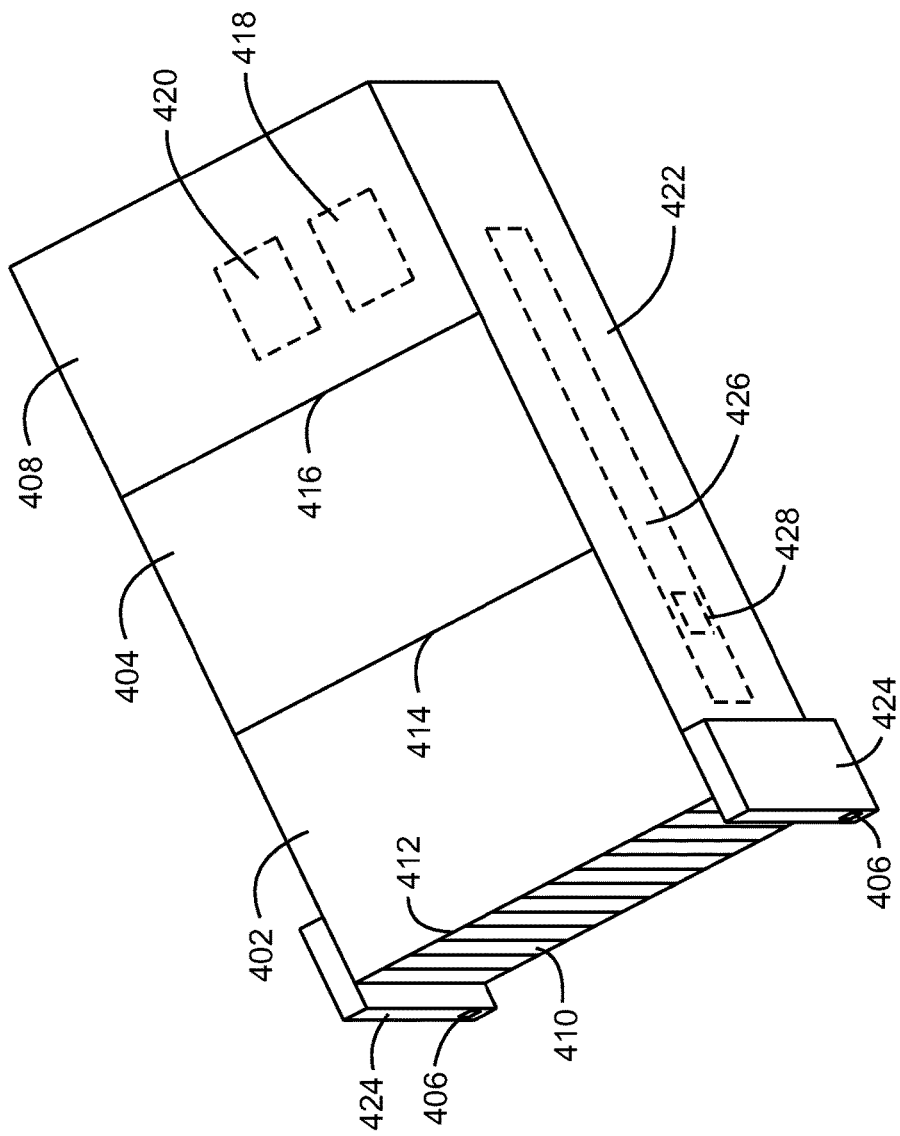
FIG. 4 is a perspective view of an example server, such as an example server for a server rack (e.g., FIGS. 1 and 2)

FIG. 4 is a perspective view of an example server 400 (similar to the server 300 of FIG. 3) having a first tray 402, a second tray 404, release latches 406, and a processing component 408. The first tray 402 may contain or hold storage drives 410. In other words, the storage drives 410 may reside in or on the first tray 402, such as in slots 412 of the first tray 402. The storage drives 410 are shown arranged vertically. In other examples, the storage drives 410 may be arranged horizontally or at other orientations. The second tray 404 located behind the first tray 402 may also contain or hold storage drives (not shown) held in slots similar to the slots 412 of the first tray 402. The storage drives 410 in or on the first tray 402 and the second tray 404 may be hard disk drives (HDDs), solid state drives (SDDs), a combination thereof, or other types of storage drives or memory. The configuration of the backplane 414 of the first tray 402 and of the backplane 416 of the second tray 404 may determine the type of storage drive 410 used.

In the illustrated example, the processing component 408 located behind the second tray 404 may include one or more processors 418, one or more memory devices 420, and other circuitry. The processor 418 may be a central processing unit (CPU) or other type of processor, and may execute code or instructions stored on the memory device 420 and/or the hard drives 410, and other code or instructions. The processor 418 can be a single core processor, a dual-core processor, a multi-core processor, a computing cluster, and the like. The memory device(s) 420 may include nonvolatile memory (e.g., read only memory or ROM), volatile memory (e.g., random access memory or RAM), and so forth. Further, memory (e.g., cache or processor memory) may be directly associated with the processor 418.

The first tray 402, the second tray 404, and the processing component 408 may be enclosed or partially enclosed by a chassis 422 which may include framing and/or siding made of sheet metal or other materials. In this example, the chassis 422 is shown as having "ears" or side assemblies 424 which may lock the chassis 422 to the first tray 402 via thumb screws. One side assembly 424 may have a drive map, which shows the numbers of the HDDs in the first tray 402 and the second try 404, e.g., the first tray 402 may hold HDDs 1-24 and the second tray 404 may hold HDDs 25-48.

In the illustrated example, a release latch 406 resides in (through) a recess in each side assembly 424 without coupling to the side assembly 424. Other configurations may be accommodated. In some examples, the release latches 406 are coupled to the first tray 402. This coupling of the release latches 406 to the first tray 402, and one or more moving elements 426 facilitate movement of the first tray 402 when the release latch 406 is engaged by a user. The release latches 406 may be analogous or similar to the release latches 104, 212, and 308 of the previous figures.

The moving element(s) 426 may provide for movement of the first tray 402 away from the second tray 404. The moving element 426 may be rails, gears, rollers, a pulley system, a rail/bearing assembly, or other types of moving elements. In some examples, a moving element 426 is disposed on each side of the server 400. The moving elements 426 may be disposed in the server 400, partially in the server 400, outside of the server 400, and/or as part of a server rack. In the illustrated example, at least one moving element 426 is disposed inside the chassis 422 of the server 400. The moving element 426 facilitates movement or extension of the first tray 402 in a direction away from the second tray 404 to provide access to a front part of the second tray 404, such as for inspecting or replacing a storage drive in the second tray 404. A locking component 428 may lock the moving element 426 in place when the first tray 402 is separated from the second tray 404 to prevent the first tray 402 from moving back toward the second tray 404. For example, the moving element may be a rail with snaps, which stop the rail from moving when the first tray 402 has separated from the second tray 404. A user may engage a rail release on the side of the rail to free the snaps and allow the rail to move again.

FIG. 5 is two perspective views of an example release latch system 500 for a server (not shown) to be installed in a server rack. The release latch system 500 has a release latch 502 and an associated latch assembly 504. In certain examples, the release latch 502 and associated latch assembly 504 are coupled to a first tray of a server and move with the first tray. The release latch 502 includes a tab 506, a neck 508, a latching component (e.g., hook 510), and a base 512. When the release latch 502 is not engaged, the tip portion of the hook 510 may reside in an indentation, for instance, in a recess of the chassis of the server. The latch assembly 504 may include a spring 514 that may provide the tension to maintain the hook 510 in the indentation. The placement of the hook 510 in the indentation may substantially prevent the first tray from moving from the server. When the release latch 502 is engaged by a user, the latch assembly 504 may rotate about a pivot screw 516, the spring 514 compresses, and thus the hook 510 rises out of the indentation. The first tray thereby may be freed to move when the user pulls on the release latch 502 in this example. The latch assembly 504, including the spring 514, may move with the first tray.

Figure 6:
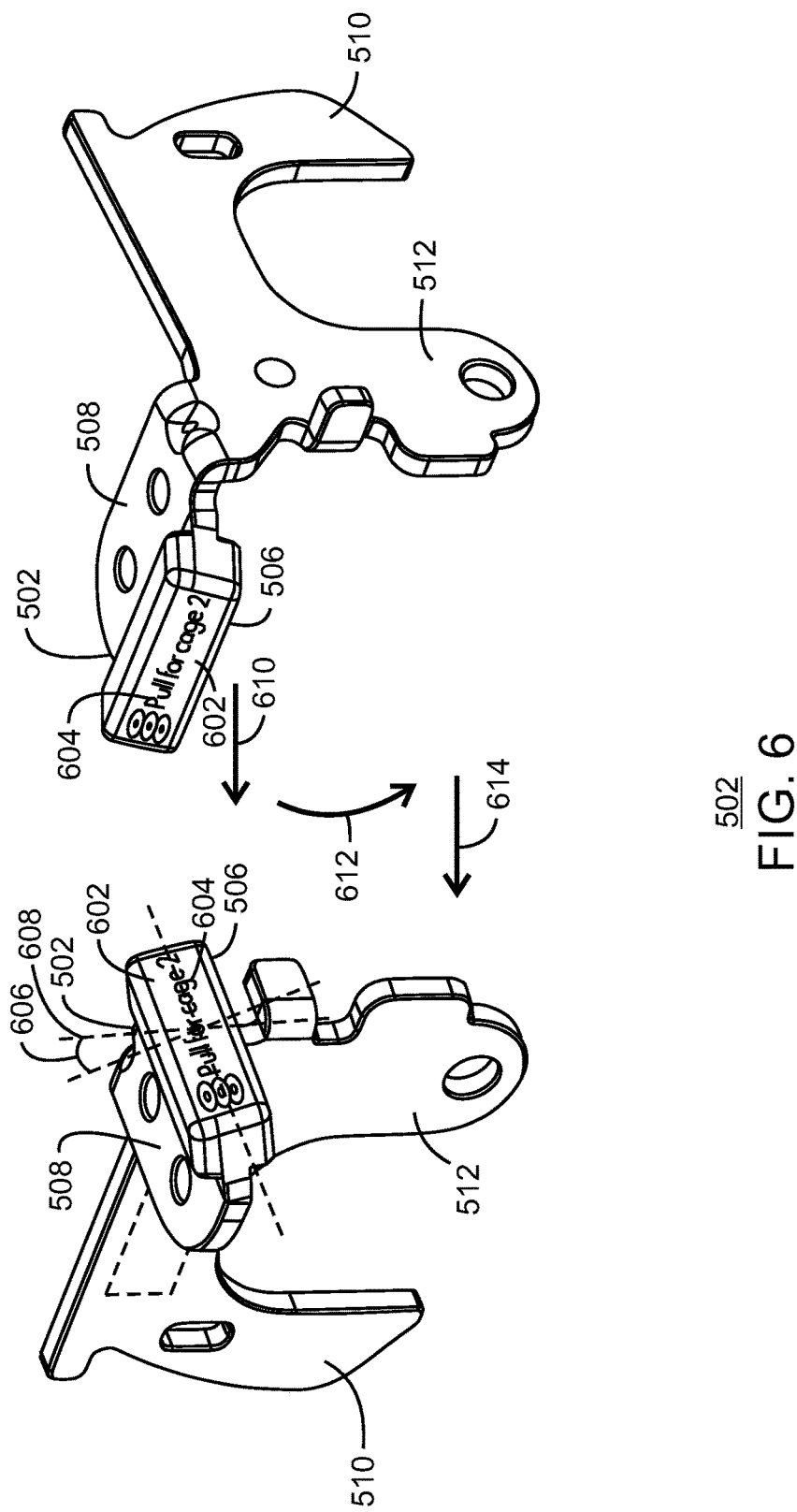
FIG. 6 is perspective views of the example release latch of the latch assembly of FIG. 5.

FIG. 6 is two perspective views of the release latch 502 included in the release latch system 500 of FIG. 5. A surface 602 of the tab 506 of release latch 502 may be imprinted or engraved with text 604. The text 604 may indicate that the second tray is accessed by engaging the release latch 502 or release latch assembly 500. The front surface 602 of the release latch 502 may be tilted upward at an angle 606 of about 30° to about 60° with respect to a vertical axis 608 of the release latch 502 when the release latch 502 is not engaged by a user. The front surface 602 may be tilted to promote visibility of the text 604.

FIG. 6 shows one example of how the release latch 502 moves when engaged by a user. Arrow 610 indicates that the user may pull the release latch 502 first. Next, the release latch 502 may be rotated downward as indicated by arrow 612. This downward rotation may free the hook 510 from an indentation in the chassis (as mentioned with respect to FIG. 5). Once the hook 510 is clear of the indentation, the first tray may be moved when the user pulls on the release latch 502 as indicated by arrow 614. In certain examples, this pulling separates the first tray from the second tray.

Figure 7B:
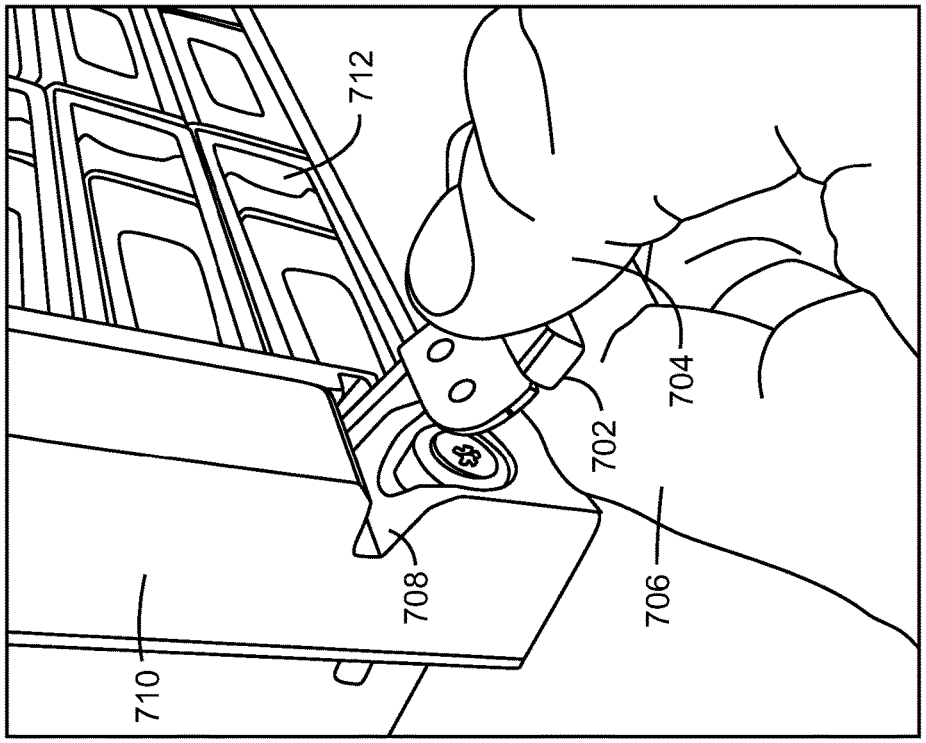
FIG. 7B is a drawing depicting a user's hand engaging the example release latch of a server.
Figure 7A:
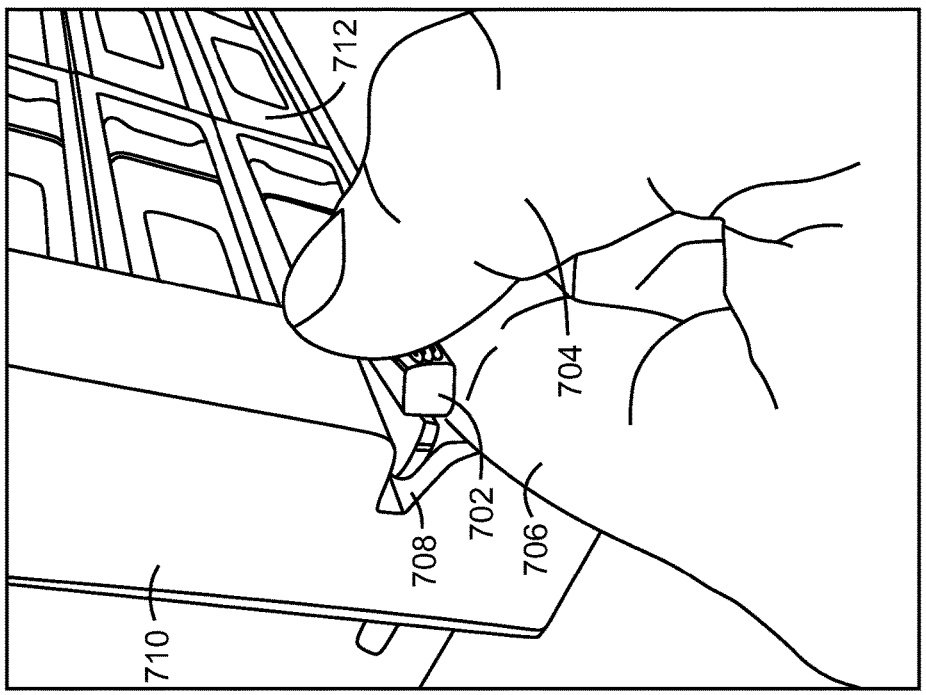
FIG. 7A is a drawing depicting a user's hand engaging the example release latch of a server.

FIGS. 7A and 7B are drawings of the lower front corner of a server 700 showing how a user may engage a release latch 702. As shown in FIG. 7A, the user may grasp the release latch 702 between his thumb 704 and forefinger 706 and may pull the release latch 702 from a recess 708 in a side assembly 710 of the server 700 (e.g., analogous to arrow 610 in FIG. 6). As shown in FIG. 7B, the user may continue to grasp the release latch 702 between his thumb 704 and forefinger 706 and may rotate the release latch 702 downward (e.g., analogous to arrow 612 in FIG. 6). The downward rotation of the release latch 702 may free the latching component (e.g., hook) of the release latch 702 from an indentation in the bottom of the chassis of the server 700 (as mentioned for the similar hook with respect to FIGS. 5 and 6). Once the release latch 702 has been rotated downward, the user may pull the release latch 702 to separate a first tray 712 from a second tray (e.g., analogous to arrow 614 in FIG. 6).

Figure 8:
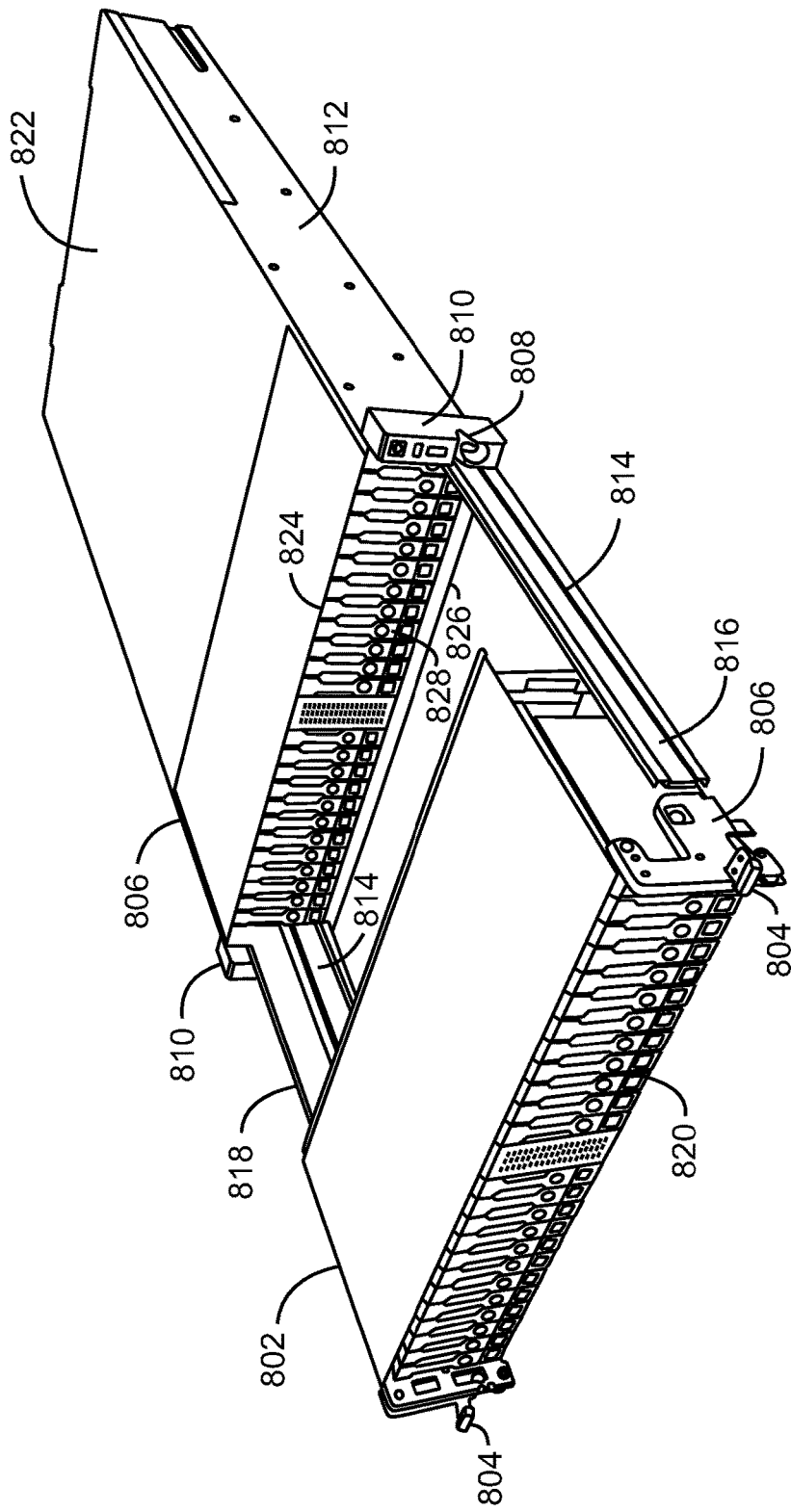
FIG. 8 is a perspective view of an example server after movement of a first tray from a second tray induced by engaging a release latch.

FIG. 8 is a perspective view of a server 800 having a latch assembly 806 after movement of the first tray 802 is induced by engaging the release latch 804 of the latch assembly 806. In some examples, the release latch 804 may be attached to the first tray 802 (as mentioned for the release latch with respect to FIG. 5). The release latch 804 may extend from the first tray 802. The release latch 804 may reside in a recess 808 of the side assembly 810 of the chassis 812 when the first tray 802 is pushed back inside the chassis 812.

Figure 9:
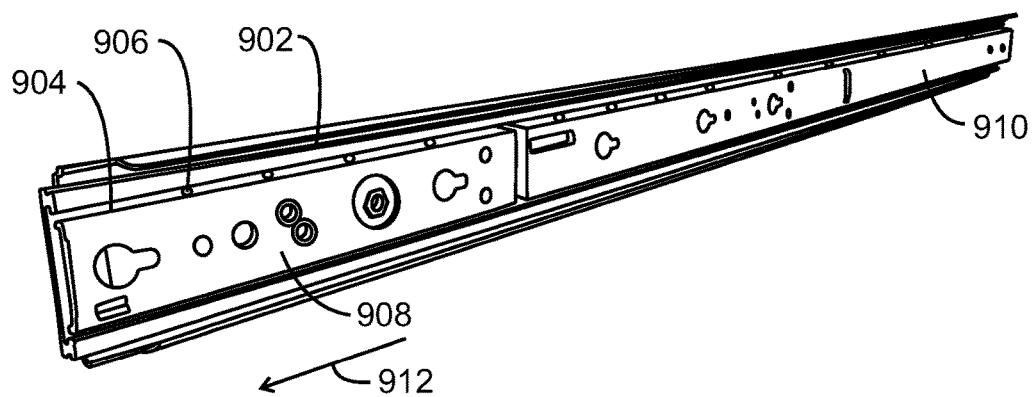
FIG. 9 is a perspective view of an example rail assembly of a server.

The first tray 802 may move via a moving element such as rail assembly 814. Each rail assembly 814 may have an inner rail and an outer rail. The inner rail may ride on ball bearings inside the outer rail. One end 816 of a rail assembly 814 may be connected to the first tray 802 and the opposite end of the rail assembly 814 may be attached to the inside of the chassis 812. (One example of a rail assembly is shown in FIG. 9.) In some examples, a cavity 818 may be located above the rail assembly 814. In other examples, the cavity 818 may be a part of the rail assembly 814. The cavity 818 may hold the cable that couples the first tray 802 of storage drives 820 to the processing component 822 (as described more fully below).

When release latches 804 are engaged by a user, the first tray 802 may extend or move away from the second tray 806 while the second tray 806 remains in place or stationary. On the other hand, once the first tray 802 is separated from the second tray 806, the rail assemblies 814 may engage the second tray 806 and move the second tray 806 away from the processing component 822 in certain examples. In a specific example, a front edge 824 of the second tray 806 generally does not move beyond a front end 826 of the chassis 812. In that example, once the front edge 824 of the second tray 806 is near, or generally flush with, the front end 826 of the chassis 812, the first tray 802 may lock into place to substantially prevent or reduce inadvertent inward movement of the first tray 802 while a user is accessing a storage drive 828 in the second tray 806. The first tray 802 may also lock into place without respect to the position of the second tray 806 in some examples. A locking component (e.g., 428 of FIG. 4) may lock the first tray 802 into place when the first tray 802 is extended beyond the front end 826 of the chassis 812.

FIG. 9 is a perspective view of the rail assembly 814 shown in FIG. 8. The rail assembly 814 may have an outer rail 902 and an inner rail 904. The inner rail 904 may ride on ball bearings 906 located between the outer rail 902 and the inner rail 904. A front end 908 of the rail assembly 814 may be coupled to the first tray of a server and a back end 910 of the rail assembly 900 may be attached to the inside of the server chassis. In the illustrated example, when a release latch is pulled by a user, the rail assembly 814 extends in the direction of the arrow 912. As it is extended, the rail assembly 814 may facilitate the separation of the first tray of a server from the second tray of the server.

Figure 10:
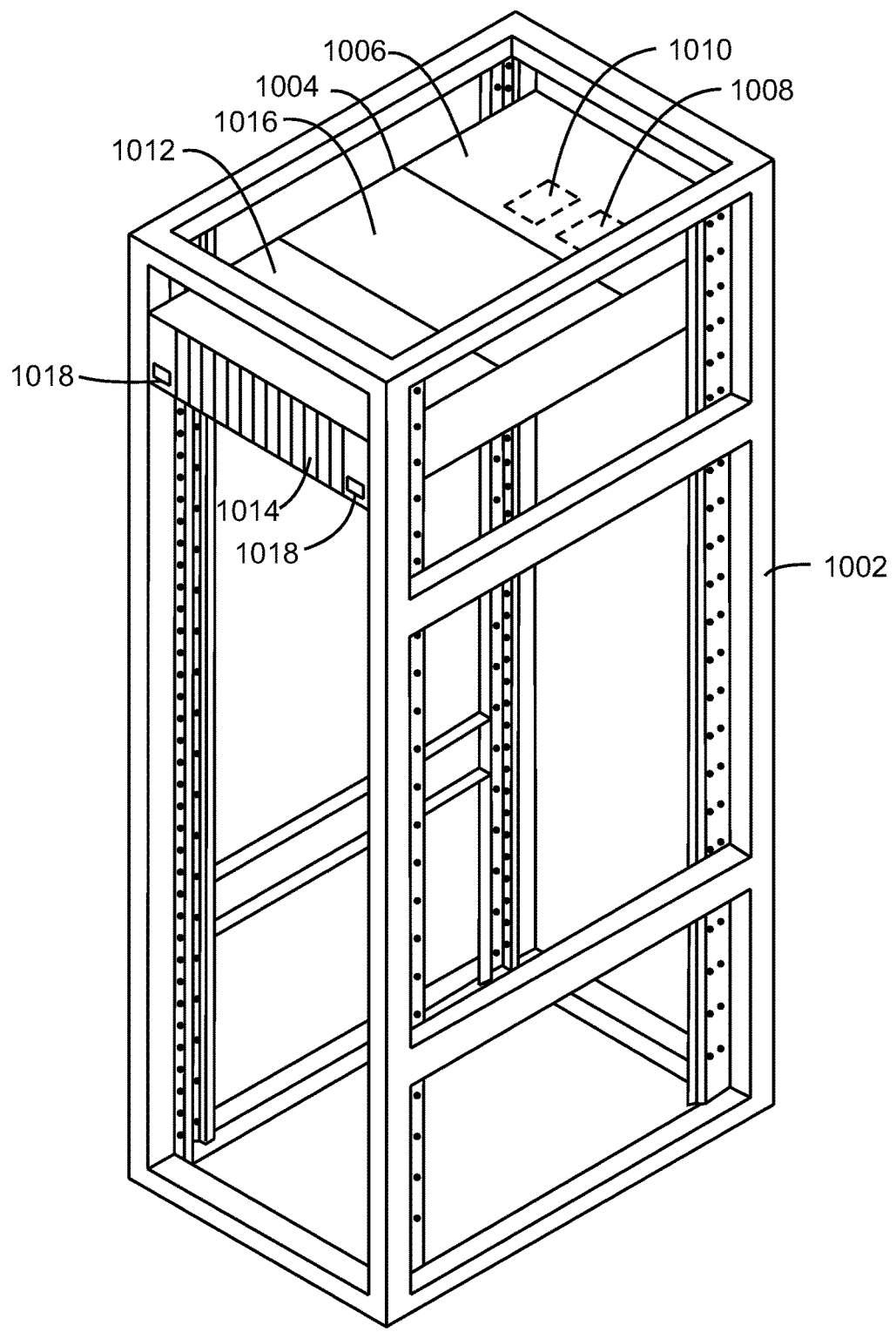
FIG. 10 is a perspective view of an example server rack holding a server.

FIG. 10 is a perspective view of a server rack 1000. The server rack 1000 may include a frame 1002 and a server 1004. In this view, the server 1004 is shown without a faceplate, e.g., either the server 1004 does not typically have a faceplate, or the faceplate has been removed, or the like. A processing component 1006 may be located at a back portion of the server 1004, or elsewhere in the server 1004. The processing component 1006 may include a processor 1008 and memory 1010, such as volatile memory or other types of memory. A first tray 1012 of storage drives 1014 may be located at the front portion of the server 1004. The storage drives 1014 of the first tray 1012 may be coupled to the processing component 1006. For example, the storage drives 1014 may be coupled to the processing component 1006 by a cable. A second tray 1016 of storage drives may be located in the middle portion of the server 1004 between the first tray 1012 and the processing component 1006. The storage drives of the second tray 1016 may also be coupled to the processing component 1006. For example, the storage drives may be coupled to the processing component 1006 by a cable. The server 1004 may include a release latch 1018 on the front of the server 1004. The release latch 1018 may initiate movement of the first tray 1012 relative to the second tray 1016 to facilitate access to a storage drive of the second tray 1016.

Figure 11A:
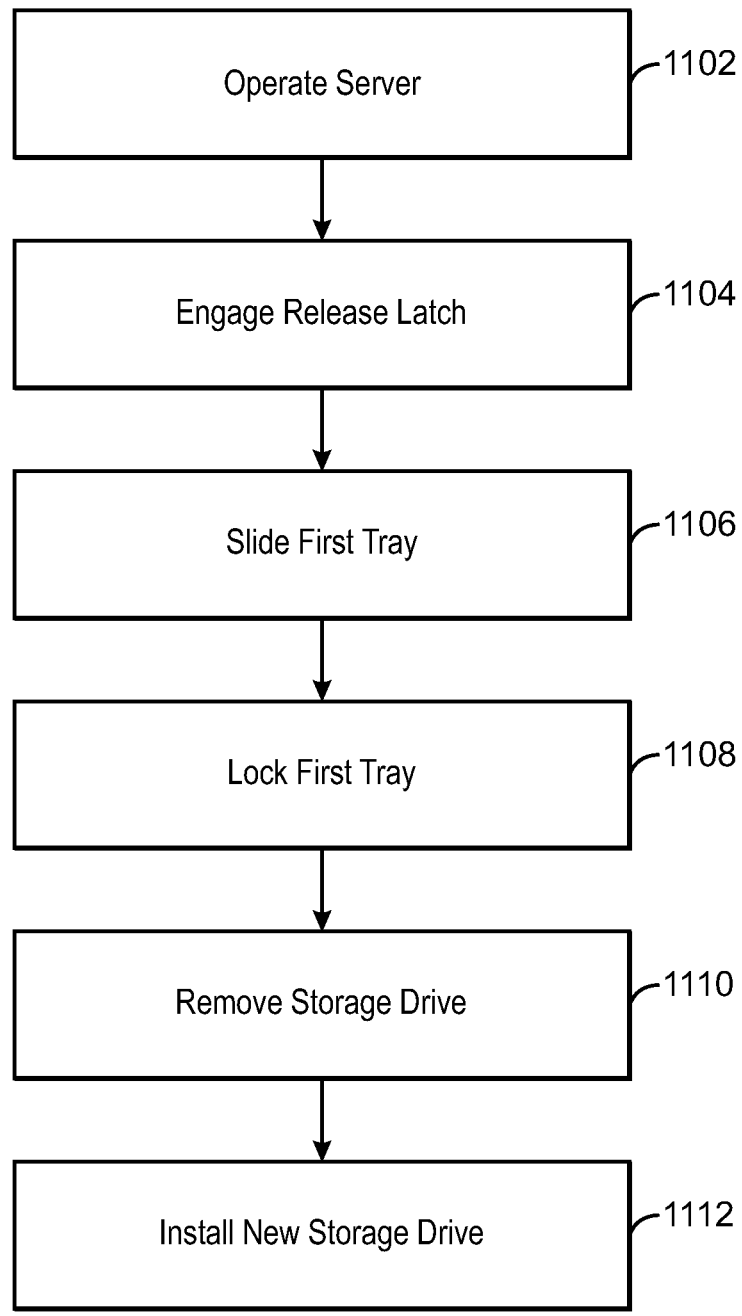
FIG. 11A is a process flow diagram of an example method for operating and maintaining a server.

FIG. 11A is a process flow diagram of an example method 1100 for operating and maintaining a server. At block 1102, the method includes operating the server such as reading and writing data to storage drives of the server. The server may be a standalone computing device. Alternatively, the server may be included in a server rack. In this example, the method 1100 may be performed while operating the server, i.e., while the server is active and in operation. For instance, a tray of hard drives may be accessed and a hard drive replaced while the server remains in operation. At block 1104, a release latch is engaged by pulling and then rotating downward. This may disengage the first tray from the chassis and/or the second tray, and free the first tray to move via a moving element such as rails inside the chassis of the server. A faceplate (or other front or obstruction), if present, may be removed so that the user may better engage the release latch. Though, in examples, the release latch may be readily engaged with a faceplate present. At block 1106, the user slides the first tray by pulling on the release latch. The first tray may separate from the second tray exposing hard drives in the second tray.

At block 1108, the first tray is locked into position to reduce or prevent inward movement of the first tray while the user is accessing the second tray. At block 1110, a storage drive is removed from the second tray. The storage drive may be faulty necessitating its removal, for example. At block 1112, a new storage drive is installed in the second tray. In certain examples, the storage drives are hot pluggable, which means that they may be removed and installed while the server is in operation. In other words, in some examples, the server need not be turned off to replace a storage drive.

FIG. 11A is not intended to imply that every block is needed or that additional blocks may not be added. For example, some blocks in FIG. 11A, such as blocks 1110 and 1112, may be omitted if a user only wants to check the status of a storage drive in the second tray without removing the storage drive. Further, blocks may be added to indicate that the server is returned to its normal configuration (i.e., the first tray is against the second tray and the second tray is against the processing component).

Figure 11B:
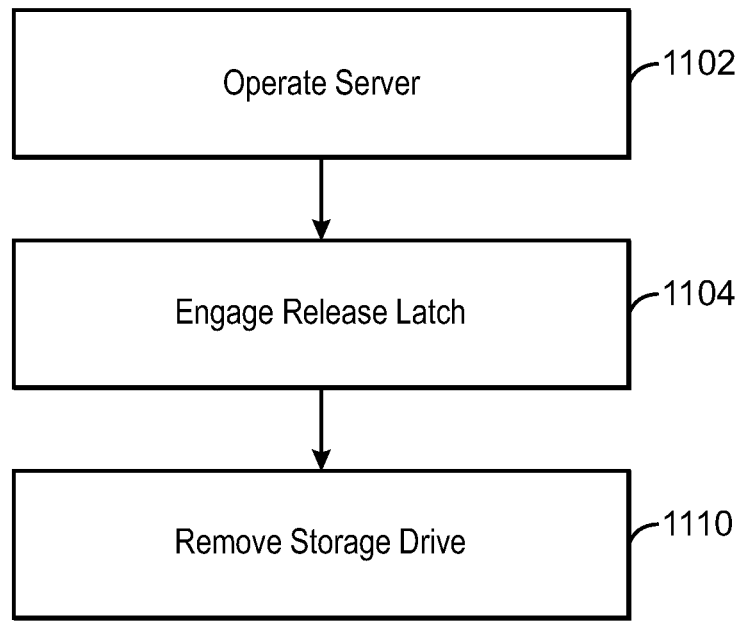
FIG. 11B is a process flow diagram of an example method for operating and maintaining a server.

FIG. 11B is a process flow diagram of an example method 1100 for maintaining a server. The method is comprised of blocks 1102, 1104, and 1110. Like numbered items are as described with respect to FIG. 11A.

While the present techniques may be susceptible to various modifications and alternative forms, the exemplary examples discussed above have been shown only by way of example. It is to be understood that the techniques are not intended to be limited to the particular examples disclosed herein. Indeed, the present techniques include all alternatives, modifications, and equivalents falling within the scope of the present techniques.

What is claimed is:

1. A method comprising:
    operating a server in a rack, the server comprising a first tray, a second tray, and a processing component, wherein the second tray is behind the first tray on a same level of the server;
    engaging a latch to initiate moving the first tray from the second tray to facilitate access to a storage drive in the second tray; and
    removing the storage drive from the second tray while the server remains in operation,
    wherein a front surface of the latch comprises text related to access of the second tray, and wherein the front surface is tilted upward at an angle about 30° to about 60° with respect to a vertical axis of the front surface to promote visibility of the text when the latch is not engaged.

2. The method of claim 1, wherein the processing component comprises a processor, memory, and other circuitry, and wherein the first tray and the second tray each comprise multiple storage drives.

3. The method of claim 1, wherein moving the first tray comprises sliding the first tray to at least partially outside of the server, and further comprising locking the first tray in place when the first tray is moved from the second tray.

4. The method of claim 1, comprising installing a new storage drive into the second tray to replace the storage drive removed.

5. The method of claim 1, wherein the latch comprises a release latch, and wherein engaging the release latch comprises rotating or pulling the release latch, or a combination thereof.

6. The method of claim 1, wherein engaging the latch releases a latch component associated with the first tray from a chassis of the server.

7. A server for a rack, the server comprising:
    a processing component at a back portion of the server;
    a first tray at a front portion of the server;
    a second tray at a middle portion of the server behind the first tray, wherein the first tray and the second tray are on a same level of the server; and
    a release latch on the front portion of the server to initiate movement of the first tray with respect to the second tray to facilitate access to the second tray,
    wherein a front surface of the release latch comprises text indicating the second tray is accessed by engaging the release latch, and wherein the front surface, when the release latch is not engaged, is tilted upward at an angle about 30° to about 60° with respect to a vertical axis of the front surface to promote visibility of the text.

8. The server of claim 7, wherein the processing component comprises a processor and volatile memory, and wherein the first tray comprises a first set of storage drives coupled to the processing component, and the second tray comprises a second set of storage drives coupled to the processing component.

9. The server of claim 7, wherein the release latch comprises a latching component engaged with a chassis of the server.

10. The server of claim 9, wherein the latching component comprises a hook.

11. The server of claim 7, comprising rails and a locking component, wherein the movement comprises sliding of the first tray from the second tray via the rails, and locking of the first tray in place via the locking component when the first tray is moved from the second tray.

12. The server of claim 7, wherein the release latch is at least one of rotated or pulled to initiate movement of the first tray.

13. The server of claim 7, wherein the server comprises a removable faceplate at a front of the first tray.

14. A server rack comprising:
    a frame; and
    a server disposed on a level of the server rack, the server comprising:
        a processing component at a back portion of the server;
        a first tray at a front portion of the server;
        a second tray at a middle portion of the server and behind the first tray; and
        a release latch on the front portion of the server to initiate movement of the first tray with respect to the second tray to facilitate access to the second tray,
        wherein a front surface of the release latch comprises text indicating the second tray is accessed by engaging the release latch, and wherein the front surface is tilted upward at an angle about 30° to about 60° with respect to a vertical axis of the front surface when the release latch is not engaged by a user to promote visibility of the text.

15. The server rack of claim 14, wherein:
    the processing component comprises a processor and volatile memory;
    the first tray comprises a first set of storage drives coupled to the processing component; and
    the second tray comprises a second set of storage drives coupled to the processing component, wherein the first tray and the second tray are on a same level of the server, and wherein the release latch is to initiate the movement of the first tray with respect to the second tray to facilitate access to a storage drive of the second tray.

16. The server rack of claim 14, wherein the release latch comprises a hook engaged with a chassis of the server.

17. The server rack of claim 14, wherein the release latch is at least one of pulled or rotated to initiate movement of the first tray, and wherein the movement comprises sliding the first tray from the second tray via a moving element to at least partially outside the server rack, and locking via a locking component the first tray in place when moved from the second tray.

* * * * *